United States Patent [19]
Averbeck et al.

[11] Patent Number: 5,994,722
[45] Date of Patent: Nov. 30, 1999

[54] IMAGE DISPLAY DEVICE THAT EMITS MULTICOLORED LIGHT

[75] Inventors: Robert Averbeck, München, Germany; Helmut Tews, Poughkeepsie, N.Y.

[73] Assignee: Siemens Aktiengesellschaft, Munich, Germany

[21] Appl. No.: 09/107,378

[22] Filed: Jun. 30, 1998

Related U.S. Application Data

[63] Continuation of application No. PCT/DE97/02478, Oct. 24, 1997.

[30] Foreign Application Priority Data

Oct. 31, 1996 [DE] Germany ............................ 196 45 035

[51] Int. Cl.⁶ .................................................... H01L 33/00
[52] U.S. Cl. .............................. 257/89; 257/99; 257/103; 372/43; 372/49; 372/50
[58] Field of Search ................................. 257/81, 82, 89, 257/91, 92, 98, 99, 103; 372/43, 49, 50

[56] References Cited

U.S. PATENT DOCUMENTS

| | | |
|---|---|---|
| 3,659,136 | 4/1972 | Gradkiewicz et al. . |
| 5,543,638 | 8/1996 | Nettelbladt et al. ........................ 257/98 |
| 5,693,962 | 12/1997 | Shi et al. ................................... 257/89 |

FOREIGN PATENT DOCUMENTS

| | | |
|---|---|---|
| 0488753 A1 | 6/1992 | European Pat. Off. . |
| 0151 828 | 11/1981 | Germany . |
| 2820889 C2 | 10/1984 | Germany . |
| 4313798 A1 | 11/1993 | Germany . |

OTHER PUBLICATIONS

German Utility Model G 90 13 615.2 dated Jan. 24, 1991, "Electro–Luminescense of Lasar Diode".
International Publication WO 97/48138 (Mensz, P. et al.), dated Dec. 18, 1997, Visible Light Emitting Devices Including UV–Light Emitting Diode And UV–Excitable, Visible Light Emitting Phosphor, And Method Of Producing Such Devices.

Japanese Journal of Appl. Physics, vol. 35, No. 7A dated Jul. 1, 1996, pp. 838–839 "Full–Color Fluorescent Display Devices Using A Near–UV Light–Emitting Diode".

Japanese Patent Abstract No. 08167735 (Kuma S.), dated Jun. 25, 1996 "Light Emitting Element".

IEEE Transactions on Consumer Electronics, vol. CE–21, No. 3, Aug. 1975, pp. 213–219 (Van Raalte, J.A.), "Matrix TV Displays: Systems And Circuit Problems".

Publication in Fernseh–und Kino–Technik (Television and Cinema Technology), No. 47, Edition No. 4/1993, pp. 231–242, "Flachbildschirme . . . der weite Weg zu Nipkows Vision" [Flat Television Screens . . . The Vast Road to Nipkows Vision].

*Primary Examiner*—Ngân V. Ngô
*Attorney, Agent, or Firm*—Herbert L. Lerner; Laurence A. Greenberg

[57] ABSTRACT

The high-resolution image display device emits multicolored light from a monolithically integrated array. The monolithically integrated array has a transparent or at least translucent substrate. One side of the substrate carries semiconductor light emitting diodes or semiconductor laser diode devices emitting in the UV wavelength range. Many luminescence converting elements with luminescent substances of a predetermined color are applied to the substrate. The elements are optically separated from one another and associated with the semiconductor light emitting diode or semiconductor laser diode device. The elements receive the light emitted in the UV wavelength range by the semiconductor light emitting diode or semiconductor laser diode device, convert it into visible light, and emit the light in the visible spectrum.

15 Claims, 1 Drawing Sheet

IMAGE DISPLAY DEVICE THAT EMITS MULTICOLORED LIGHT

CROSS-REFERENCE TO RELATED APPLICATION

This is a continuation of copending international application PCT/DE97/02478, filed Oct. 24, 1997, which designated the United States.

BACKGROUND OF THE INVENTION

Field of the Invention

The invention relates to an image display device emitting multicolored light, in particular a high-resolution image display device, with a monolithically integrated array.

As substitute for currently used cathode ray tubes for high-resolution colored display of images, image display devices with a monolithically integrated array are currently being developed, which can be produced by production steps used in semiconductor technology. Due to their markedly reduced structural height, the new technology can be provided for entirely new kinds of applications, such as eyeglasses with a built-in color display, or the like. Although LEDs or similar light-emitting individual semiconductor components, which light up in different colors, are already available, nevertheless the production of high-resolution multicolor image display devices presents considerable technical difficulties, among other reasons because LEDs for the three basic colors of red, green and blue cannot be produced using a uniform epitaxial technique. Because of the major differences in material of the individual semiconductor components lighting up in different colors that are required to produce such displays, where the basic materials are GaAsP:N, InGaAlP, and InGaAlN, no solution to the technical difficulties can be expected even in the future. The currently practiced mounting of various finished LED chips on one substrate involves very high costs and is also associated with an only slight attainable resolution.

John van Raalte, in "Matrix TV Displays: Systems and Circuit Problems", published in IEEE Transactions on Consumer Electronics, Vol. CE-21, No. 3, Aug. 1975, pp. 213–219, discloses a plasma image display device emitting multicolored light. There, plasma elements that emit UV light can be combined with photoluminescence phosphors. Television display devices are also known in which LEDs are arranged in the form of a matrix.

Claus Reuber, in "Flachbildschirme . . . der weite Weg zu Nipkows Vision" [Flat Screens—the Long Trail to Nipkow's Vision], published in FERNSEH- UND KINO-TECHNIK [Television and Motion Picture Technology], Vol. 47, No. 4, 1993, pp. 231–242, discloses a television picture reproducing device operating on the principle of the gas discharge technique. In that context it is also known that for full-color reproduction, the neon-argon mixture that lights in an orange red must be replaced with a gas mixture that produces ultraviolet radiation, and the UV must be transformed with luminous substances into the basic colors RGB.

From East German Patent Disclosure DD 0 151 828, it is known to render UV light visible by having the ultraviolet light incite photoluminescence at a suitable point.

German Patent DE 28 20 889 C2 deals with luminescing substances of oxides of alkali metals, rare earths and phosphorus, and their use in cathode ray tubes, as well as devices for converting UV light into visible light.

SUMMARY OF THE INVENTION

It is accordingly an object of the invention to provide a novel multicolor display device, which is technologically simple to produce and which displays suitable images in multicolored light.

With the foregoing and other objects in view there is provided, in accordance with the invention, an image display device that emits multicolored light, comprising:

a substrate;

a multiplicity of individually electronically triggered semiconductor light emitting diodes or laser diodes disposed on or in the substrate;

a multiplicity of optically separate luminescence converting elements assigned to the semiconductor diodes;

the luminescence converting elements being provided with luminescent substances of a different color, the luminescent substances each absorbing at least a portion of light emitted by the semiconductor diodes, converting the light into visible light of a different wavelength, and emitting the visible light.

In accordance with an added feature of the invention, the semiconductor LEDs or semiconductor laser devices emit light in the ultraviolet or blue wavelength range. The particular advantage of a semiconductor light emitting diode or semiconductor laser diode emitting in the UV wavelength range is that it transmits no, or markedly less, visible and hence possibly disturbing residual radiation. Instead of a semiconductor light emitting diode or laser diode that emits in the UV wavelength range, such a diode that emits blue light can be used.

In accordance with an additional feature of the invention, the luminescence converting elements are provided in alternation with the luminescent substances of at least two basic colors red and green or of three basic colors red, green and blue.

In accordance with a further feature of the invention, the luminescent substances are ZnS:Ag, ZnS:Cu,Al and ZnCdS:Ag, respectively, for the basic colors red, green and blue.

In other words, the luminescence converting elements mounted on the substrate are equipped in alternation with luminescent substances of the basic colors. The substances are selected such that upon irradiation especially with UV light, the entire visible spectrum can be covered. In particular, it may be provided that ZnS:Ag, ZnS:Cu,Al and ZnCdS:Ag, respectively, are used as pigments for the luminescence converting elements that emit in the basic colors of red, green and blue. It is equally possible, however, to use phosphors, such as YAg:Ce and other garnets, thiogallates, aluminates or orthosilicates doped with rare earths, as the luminous substances.

In the case where semiconductor light emitting diodes or semiconductor laser diodes emitting in the UV wavelength range are used, the luminescence converting elements are equipped alternatingly with luminescent substances of the three basic colors red, green and blue. In the case of semiconductor light emitting diodes or semiconductor laser diodes that emit blue light, intrinsically only the two basic colors green and red are required for the luminescence converting elements, since the basic color blue is already emitted by the LEDs or laser diodes.

In accordance with again another feature of the invention, the substrate is transparent (or at least translucent), and the luminescence converting elements are disposed on a side of the substrate remote from the semiconductor diodes. This is an embodiment of the invention that is especially simple to produce.

It is advantageously provided that the transparent or at least translucent substrate is a sapphire substrate. The sapphire advantageously used as the substrate material is available relatively economically with large surfaces (typically, wafer diameters of three inches and more can be obtained), and because of its remarkably high mechanical stability, it offers the mechanical properties that are demanded simultaneously along with the electronic properties.

In accordance with again an additional feature of the invention, the luminescence converting elements are disposed on a same side of the substrate as the semiconductor diodes, and including a transparent or translucent electrically conductive contact layer between individual the electronically driven semiconductor diodes and the luminescence converting elements. In that case, the normally nontransparent connection lines cover only part the connection region for the semiconductor light emitting diodes or semiconductor laser diodes. For widening the current and thus for more-optimal bunching of the electrical current, this transparent or at least translucent contact layer is then used. The pigments of the luminescence converting elements can expediently be applied directly onto this transparent contact layer, or onto an intermediate layer, or embedded in a special casting composition.

In accordance with again an added feature of the invention, the semiconductor diodes are formed with a basic material of GaN monolithically integrated on or in the substrate. In other words, the basic material of the monolithically integrated semiconductor light emitting diodes or semiconductor laser diodes has gallium nitrate GaN, or an offspring of it such as InGaN or AlGaN. Since the semiconductor material GaN is also suitable for applications in power electronics, this embodiment at the same time makes it possible to integrate line driver circuits or electronic trigger circuits.

Especially high resolving power between the individual color pixels, especially with relatively thick substrates, can advantageously be attained when the semiconductor light emitting diodes or semiconductor laser diodes and the luminescence converting elements are disposed on the same side of the substrate. In that case, the substrate may also comprise nontransparent material and/or may be provided with a mirror coating over its entire surface, with which the proportion of loss in terms of the unusable light capacity can be reduced. In the case of a transparent substrate, the mirror coating is expediently applied to the back side of the substrate, that is, the side of the substrate remote from the luminescence converting elements.

In accordance with yet another feature of the invention, a mirror coating is applied over a large area of the substrate.

In accordance with a concomitant feature of the invention, the semiconductor diodes are disposed in rows and columns and are electrically triggerable.

It can also advantageously be provided that the semiconductor light emitting diodes or semiconductor laser diodes embodied on or in the substrate have a layer sequence of semiconductor materials, in particular a layer sequence with an active layer of $Ga_xIn_{1-x}N$ or $Ga_xAL_{1-x}N$, which emit an electromagnetic radiation with a wavelength less than or equal to 480 nm, and in particular less than or equal to 370 nm; the luminescence converting element converts the radiation of a first spectral range segment, of the radiation originating in a first wavelength range emitted by the LEDs or laser diodes, into radiation of a second wavelength range. This means for instance that the luminescence converting element spectrally selectively absorbs one radiation emitted by the LEDs and emits in the longer-wave range (the second wavelength range). Ideally, the radiation emitted by the LEDs has a maximum radiation at a wavelength of less than or equal to 370 nm. A particular advantage of the image display device of the invention is also that the wavelength spectrum generated by way of luminescence conversion, and thus the color of the emitted light, does not depend on the magnitude of the operating current intensity through the semiconductor light emitting diodes or semiconductor laser diodes. This is highly significant, particularly whenever the ambient temperature of the semiconductor component, and thus as is well known the operating current intensity, fluctuates sharply. Especially LEDs having a semiconductor body on the basis of GaN are vulnerable in this respect. Moreover, the image display device of the invention requires merely a single trigger voltage and thus only a single trigger circuit arrangement, and thus the expenditure for components can be kept very low.

In another preferred refinement of the image display device of the invention, light-scattering particles, so-called diffusers, are additionally added to the luminescence converting element or some other radiation-permeable ingredient of the component sheath. As a result, the color impression and the emission characteristics of the image display device can advantageously be optimized.

Especially advantageously, the semiconductor light emitting diodes or semiconductor laser diodes embodied on or in the substrate emit UV light at wavelengths of less than or equal to 370 nm. A complete conversion of the UV light by the luminescence converting elements is not required here, because the ultraviolet component does not lead to color changes in the visible spectrum. In addition, by sealing with a UV-opaque paint or by mounting the image display device behind a pane of glass, any possibly remaining component of the emitted UV light can simply be filtered out.

Other features which are considered as characteristic for the invention are set forth in the appended claims.

Although the invention is illustrated and described herein as embodied in an image display device that emits multicolored light, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
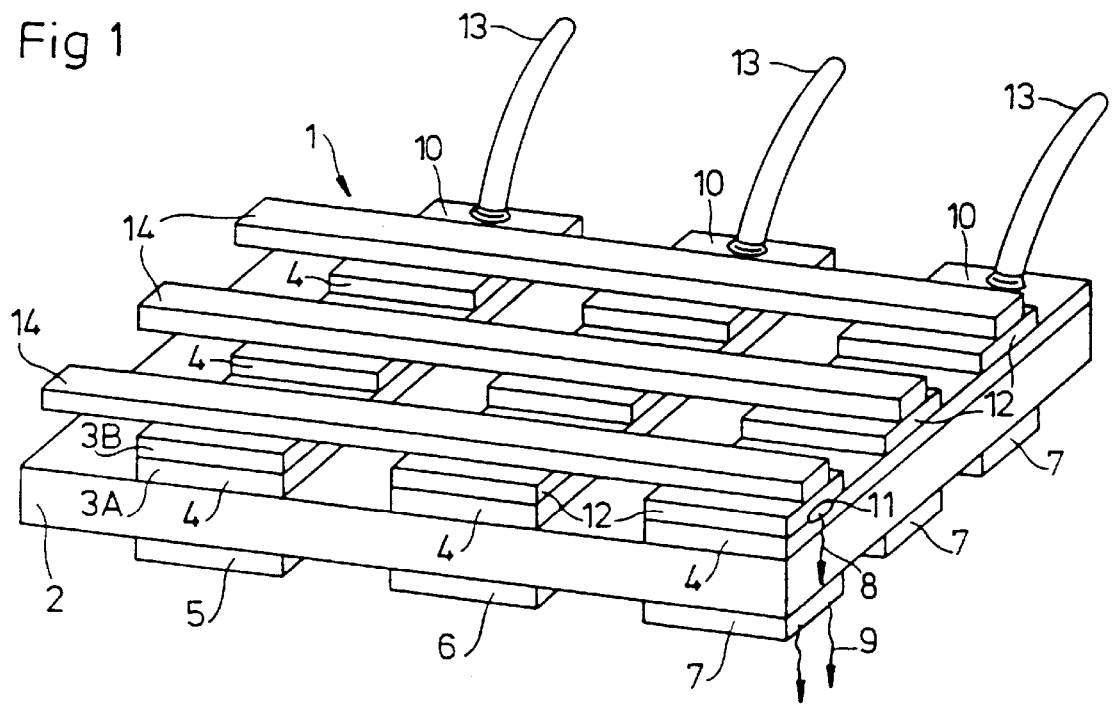
FIG. 1 is a schematic perspective view of a high-resolution image display device emitting multicolored light—a so-called true color display.

Referring now to the figures of the drawing in detail, the image display devices shown therein include a monolithically integrated array 1, comprising a transparent (or at least translucent) substrate 2 in the form of a large-area sapphire substrate. Such substrates are available relatively economically in wafer diameters of typically three inches and more. A semiconductor light source comprising GaN basic material is provided, with many electronically individually driven semiconductor light emitting diodes or semiconductor laser diodes 4 disposed in a matrix on the substrate 2 and emitting in the UV wavelength range. Each of the diodes has an n-conducting region 3A and a p-conducting region 3B. Many luminescence converting elements 5, 6, 7 with luminescent substances of different colors are provided. The luminescence converting elements 5, 6, 7 receive the light 8 emitted in the UV wavelength range by the semiconductor light emitting diodes or semiconductor laser diodes 4, convert it into visible light 9, and as shown schematically emit it in a direction that is transverse to the plane of the sapphire substrate 2. In the exemplary embodiments shown, each luminescence converting element 5 has a luminescent substance of the basic color red. Each luminescence converting element 6 has a luminescent substance of the basic color green. Each luminescence converting element 7 has a luminescent substance of the basic color blue. Each triad of luminescence converting elements 5, 6, 7 thus represents one pixel of the image display device and makes it possible to project full-color images; in a manner known per se, by means of suitable luminescent substances for the three basic colors, the entire visible spectrum can be displayed. Along with the three preferably used basic colors of red, green and blue, it is understood that other suitable basic colors are also feasible without departing from the fundamental principle of the invention. Suitable materials for the pigments of the luminescence converting elements 5, 6, 7 that light up in the three basic colors of red, green and blue are, for instance, ZnS:Ag, ZnS:Cu,Al and ZnCdS:Ag.

The semiconductor light emitting diodes 4 that emit in the UV wavelength range - formed by the conventional semiconductor technology production - include columns 10 of n-doped GaN material structured in strips directly on one side of the substrate 2, and on these columns, p-doped GaN material 12 structured to form rows forming a pn junction or a UV light-emitting region 11. The electronic triggering of the individual LEDs or laser diodes 4 is effected via metal column lines 13 and row lines 14 in the form of metal tracks, which are produced by structuring and production provisions known per se in semiconductor technology, and which for triggering the individual pixels are supplied with column and row address signals of a non-illustrated driver circuit.

Each luminescence converting element can for instance comprise a transparent epoxy resin, or silicone, thermoplastic or duroplastic material, which is provided with suitable organic or inorganic pigment molecules. Inorganic luminescent substances in particular can advantageously be distributed homogeneously in epoxy resin in a simple way. The luminescence converting elements 5, 6, 7 are applied to the substrate 2 at a constant thickness and with identical areas, preferably by screenprinting or other economic processes.

In the exemplary embodiment of FIG. 1, the semiconductor light emitting diodes 4 and the luminescence converting elements 5, 6, 7 are embodied on the two sides of the platelike substrate 2. As noted, the substrate here comprises a transparent or at least translucent material, such as sapphire.

Figure 2:
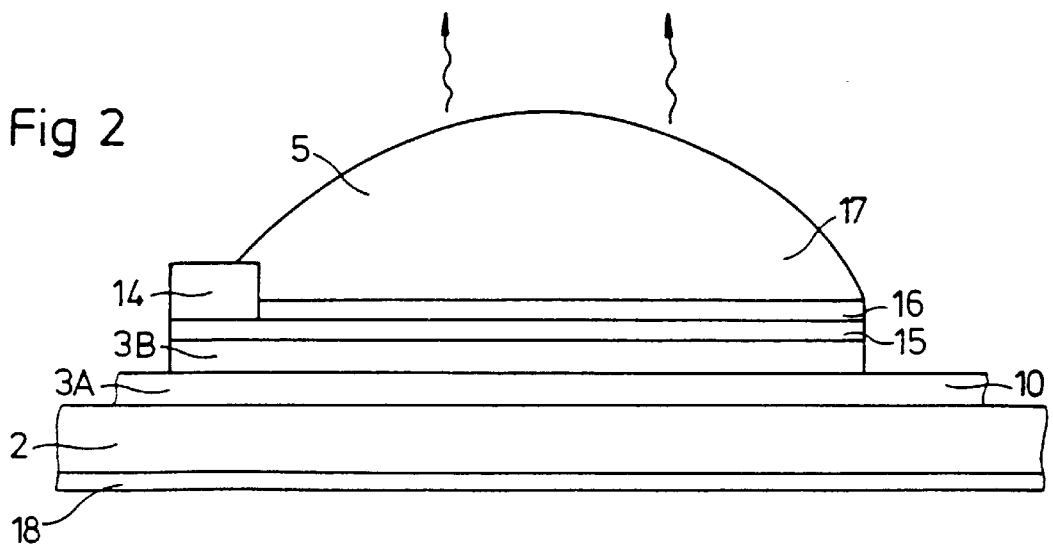
FIG. 2 is a schematic sectional view of a further embodiment of a true color display, in which the LEDs and the luminescence converting elements are formed on the same side of a substrate that is mirror-coated over its entire surface.

In the exemplary embodiment of FIG. 2, the LEDs 4 and luminescence converting elements 5 are disposed on the same side of the substrate 2. This structural form has advantages above all whenever the resolving power between the individual color pixels may not be adequate, for instance because the substrate is thicker. The row lines 14 for electrically connecting the p-conductive region 3B of each LED 4 in that case cover only part of the upper, p-conductive region 3B. For current widening, transparent contact layers 15 of electrically conductive material are provided that cover the p-conductive region 3B of each LED 4. The luminescence converting element 5 is disposed on the contact layer 15. In the illustrated embodiment, the pigment 16 is applied directly to the contact layer 15 and is coated with a transparent cover layer 17. The material for the electrically conductive, transparent contact layer 15 may for instance be indium-tin oxide; alternatively, the contact layer 15 may also comprise a thin, transparent gold film. Equally expediently, the pigment may also be embedded in a synthetic resin or similar suitable material that covers the contact layer 15 (and optionally a small portion of the row line 14).

In order to utilize the light emitted downward as well, the back side of the substrate 2 may be provided with a mirror coating 18, which may be a full surface mirror coating.

We claim:

1. An image display device that emits multicolored light, comprising:

a substrate;

a multiplicity of individually electronically driven semiconductor diodes disposed on or in said substrate;

a multiplicity of optically separate luminescence converting elements assigned to said semiconductor diodes;

said luminescence converting elements being provided with luminescent substances of a different color, said luminescent substances each absorbing at least a portion of light emitted by said semiconductor diodes, converting the light into visible light of a different wavelength, and emitting the visible light.

2. The image display device according to claim 1, wherein said semiconductor diodes are light emitting diodes.

3. The image display device according to claim 1, wherein said semiconductor diodes are semiconductor laser diodes.

4. The image display device according to claim 1, wherein said semiconductor diodes emit light in the ultraviolet wavelength range.

5. The image display device according to claim 1, wherein said semiconductor diodes emit light in the blue wavelength range.

6. The image display device according to claim 1, wherein said luminescence converting elements are provided in alternation with said luminescent substances of at least two basic colors red and green.

7. The image display device according to claim 1, wherein said luminescence converting elements are provided in alternation with said luminescent substances of three basic colors red, green and blue.

8. The image display device according to claim 7, wherein said luminescent substances are ZnS:Ag, ZnS:Cu,Al and ZnCdS:Ag, respectively, for the basic colors red, green and blue.

9. The image display device according to claim 1, wherein said semiconductor diodes are formed with a basic material of GaN monolithically integrated on or in said substrate.

10. The image display device according to claim 1, wherein said substrate is translucent, and said luminescence converting elements are disposed on a side of said substrate opposite said semiconductor diodes.

11. The image display device according to claim 10, wherein said substrate is transparent.

12. The image display device according to claim 1, wherein said luminescence converting elements are disposed on a same side of said substrate as said semiconductor diodes, and including a translucent electrically conductive contact layer between individual said electronically driven semiconductor diodes and said luminescence converting elements.

13. The image display device according to claim 12, wherein said electrically conductive contact layer is a transparent contact layer.

14. The image display device according to claim 1, which further comprises a mirror coating applied over a large area of said substrate.

15. The image display device according to claim 1, wherein said semiconductor diodes are disposed in rows and columns and are electrically triggerable.

* * * * *